United States Patent [19]
Griffin et al.

[11] Patent Number: 6,005,267
[45] Date of Patent: *Dec. 21, 1999

[54] MES/MIS FET WITH SPLIT-GATE RF INPUT

[75] Inventors: Edward L. Griffin; Dain Curtis Miller; Inder J. Bahl, all of Roanoke, Va.

[73] Assignee: ITT Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/888,526

[22] Filed: Jul. 7, 1997

Related U.S. Application Data

[63] Continuation of application No. 08/537,305, Sep. 29, 1995, abandoned.

[51] Int. Cl.$^6$ .................. H01L 29/80; H01L 31/112; H01L 29/76; H01L 29/94
[52] U.S. Cl. .................. 257/280; 257/270; 257/365; 438/157; 438/176
[58] Field of Search .................. 257/270, 280, 257/281, 365, 402, 403; 438/157, 176

[56] References Cited

U.S. PATENT DOCUMENTS

| | | | |
|---|---|---|---|
| 4,179,668 | 12/1979 | Schuermann | 330/277 |
| 5,012,315 | 4/1991 | Shur | 257/365 |

FOREIGN PATENT DOCUMENTS

| | | | |
|---|---|---|---|
| 51148358 | 6/1978 | Japan | 257/270 |

OTHER PUBLICATIONS

Ng, Kwok K., Complete Guide to Semiconductor Devices, McGraw–Hill (Pub), pp. 188–189, Jan. 1995.
Barsan, Radu M., "Analysis and Modeling of Dual–Gate MOSFET's ", IEEE Trans. Elec. Dev., vol. ED–28, No. 5, pp. 523–534, May, 1981.

*Primary Examiner*—Olik Chaudhuri
*Assistant Examiner*—Howard Weiss
*Attorney, Agent, or Firm*—Arthur L. Plevy

[57] ABSTRACT

Disclosed is an improved field effect transistor (FET) employing both a metal-semiconductor (MES) gate and a metal-insulator-semiconductor (MIS) gate, which FET is particularly useful to provide amplification at microwave frequencies. The use of the MIS gate with appropriate biasing allows the carrier density within a selected portion of the device's channel region to be controlled. The carrier density control increases the breakdown voltage of the FET and enables the FET to be operated with higher maximum channel current and a higher drain to source voltage. As a result, higher output power is provided as compared to prior art MESFET devices of a similar size. Also disclosed is an amplifier circuit including the MES/MIS FET of the present invention, which amplifier circuit further includes means coupled to the MES/MIS FET for dividing a high frequency input signal to provide a first divided portion and a second divided portion. The first divided portion is applied to the MES gate while the second divided portion is applied to the MIS gate. The second portion operates as a time varying bias voltage to control carrier density within the channel portion of the MES/MIS FET and thereby control performance parameters such as breakdown voltage and maximum available channel current.

15 Claims, 9 Drawing Sheets

MES/MIS FET WITH SPLIT-GATE RF INPUT

This is a continuation of application Ser. No. 08/537,305, filed on Sep. 29, 1995, now abandoned.

FIELD OF THE INVENTION

The present invention relates generally to Gallium Arsenide (GaAs) field effect transistors (FETs) and more particularly, to a FET employing both metal-semiconductor (MES) and metal-insulator-semiconductor (MIS) gates for improved voltage breakdown and output power capabilities.

BACKGROUND OF THE INVENTION

GaAs MESFETS are well known devices for providing amplification at microwave frequencies, high speed digital switching, and various other functions. The use of microwave frequencies in satellite and wireless communications has been growing exponentially over recent years, thereby providing a vast market for GaAs transistors. As the power output capability of MESFETs continues to improve, a single transistor can provide the power once provided by several, thereby saving considerable costs and drastically reducing the size of the amplifier modules. GaAs transistors are increasingly being used in high power transmitters to replace old designs which employed traveling wave tubes or klystrons. The higher the power handling capability and efficiency that can be achieved, the greater the number of potential applications for MESFET amplifiers. Accordingly, there has been a tremendous effort in the commercial and military industry over recent years to improve the performance capability of these GaAs devices.

The conventional MESFET employs a metal gate electrode in direct contact with a GaAs substrate to form what is known as a Schottky barrier. A voltage applied to the gate electrode influences a current carrying region beneath the gate, thereby controlling the flow of current between the drain and source electrodes and thus providing amplification or switching.

Illustrated in FIG. 1 is a cross-sectional view of a conventional n-channel MESFET 10. An n+ source region 14, n+ drain region 12, and an n doped channel region 15 are formed within a GaAs substrate 11. Gate, source and drain electrodes s, g and d, respectfully, are then formed atop the respective doped regions, with the gate electrode g typically offset towards the source electrode s for reduced parasitic source resistance. When a voltage is applied between the gate and source electrodes g and s, it controls a surface depletion region 16 formed within the channel 15, through which current flows from drain to source upon the application of a bias voltage between the drain and source electrodes.

A basic circuit arrangement for which the MESFET 10 provides amplification of an RF input signal is shown in FIG. 2. The circuit 20 amplifies the RF input signal applied to input terminal 18 to provide an amplified RF output across a load resistor $R_L$. Inductors L1 and L2 act as AC chokes to bring the DC bias voltages Vgg and Vdd to the respective gate and drain terminals of the device 10. Capacitors C1 and C2 function as DC blocks, while input and output matching structures 17 and 19 are employed to transform the relatively high input and output system impedances to generally lower device impedances, to optimize the performance of the MESFET 10.

The load line characteristics of the circuit 20 superimposed on the MESFET 10 I–V characteristics is shown in FIG. 3. As the RF input signal swings up and down during one RF cycle, so does the gate to source voltage $V_{GS}$ which causes the drain to source current $i_{DS}$ to increase and decrease, respectively. This results in the drain to source voltage $v_{DS}$ being large when the current is small, and vice versa. The load line 21 indicates that the $v_{DS}$ swing is from a "knee" voltage Vk to (2VDD−Vk), as $i_{DS}$ swings from a maximum current $i_P$ to a minimum current imin. Basically, the slope and excursion of the load line is governed by the choice of the DC bias voltages VDD and VGG, the value of the load resistance $R_L$ in conjunction with the output matching network 19, and the magnitude of the input voltage swing (i.e., the RF input power level). In any event, these parameters must be selected to prevent the voltage $v_{DS}$ from swinging too high and penetrating the breakdown region 19.

To maximize output power, it is desirable to have both a large current swing and a large voltage swing. The maximum current is limited by the channel doping and thickness, while the maximum voltage swing is set by the gate-drain breakdown voltage. One way to increase the gate-drain breakdown voltage is to increase the spacing D1 between the gate electrode g and the drain n+ region 12 (FIG. 1). This approach was the subject of an article entitled "A Novel High-Voltage High Speed MESFET using a Standard GaAs Digital IC Process", by P. Mok et al., IEEE Transactions on Electron Devices, Vol. 41, No. 2, February, 1994. In that article, breakdown voltages above 80V were reported; however, the higher the breakdown voltage which was achieved, the higher the "on-resistance" of the device, a parameter which reduces device efficiency.

A major shortcoming of either of the above approaches to increasing output power—i.e., increasing breakdown voltage or increasing maximum channel current—is that they compete directly with one another. That is, for a given geometry, increasing the channel thickness and/or doping level of the channel to increase the maximum channel current will decrease the gate to drain breakdown voltage. Moreover, increasing the spacing between the gate electrode and the drain n+ region 12 to increase the breakdown voltage actually decreases the maximum channel current. (This latter effect has been measured using a technique of applying short duration voltage pulses between the gate and source in the absence of RF input power, and then measuring the peak $i_{DS}$ current. This technique is believed to be more representative of the FET's behavior under RF drive than the conventional method of applying DC voltages to the device to measure the maximum current).

Accordingly, there is a need for a GaAs transistor which has both higher gate-drain breakdown voltage and higher current handling capability to yield higher RF power output performance. It is an object of the present invention to provide such a transistor.

SUMMARY OF THE INVENTION

The present invention is directed towards an improved field effect transistor (FET) employing both a metal-semiconductor (MES) gate and a metal-insulator-semiconductor (MIS) gate, which FET is particularly useful to provide amplification at microwave frequencies. The use of the MIS gate with appropriate biasing allows the carrier density within a selected portion of the device's channel region to be controlled. The carrier density control increases the breakdown voltage of the FET and enables the FET to be operated with higher maximum channel current and a higher drain to source voltage. As a result, higher output power is provided as compared to prior art MESFET devices of a similar size.

The invention is also directed towards an amplifier circuit including the MES/MIS FET of the present invention, which amplifier circuit further includes means coupled to the MES/MIS FET for dividing a high frequency input signal to provide a first divided portion and a second divided portion. The first divided portion is applied to the MES gate while the second divided portion is applied to the MIS gate. The second portion operates as a time varying bias voltage to control carrier density within the channel portion of the MES/MIS FET and thereby control performance parameters such as breakdown voltage and maximum available channel current.

BRIEF DESCRIPTION OF THE DRAWINGS

For a full understanding of the present invention, reference is had to an exemplary embodiment thereof, considered in conjunction with the accompanying drawings wherein like reference numerals designate like features, for which.

DETAILED DESCRIPTION OF THE INVENTION

Figure 1:
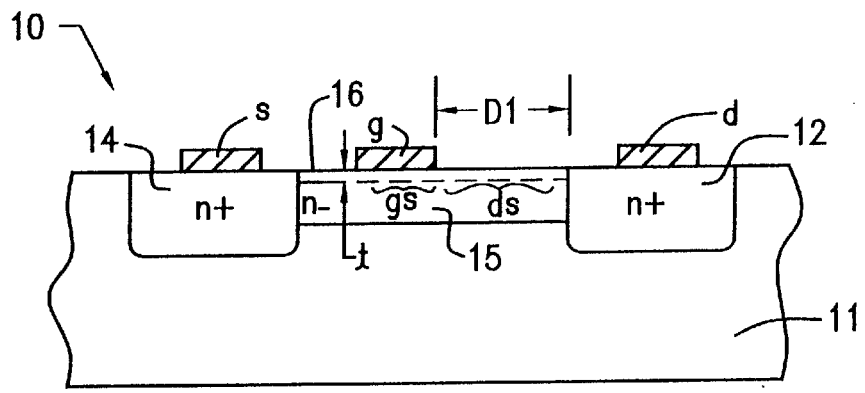
FIG. 1 is a cross section of a prior art MESFET device.
Figure 3:
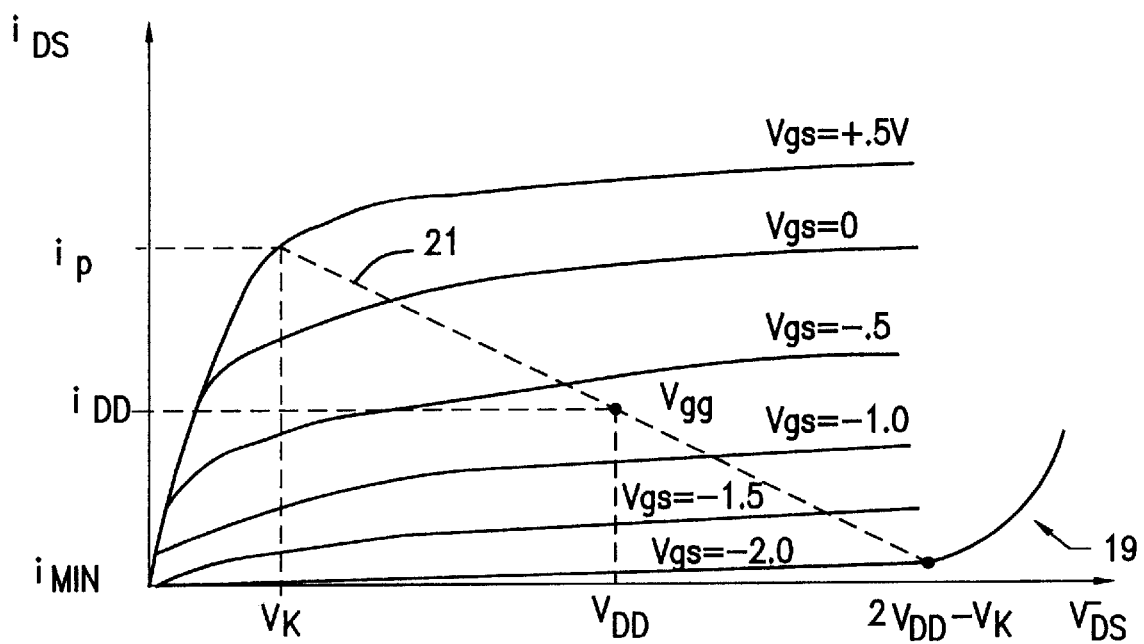
FIG. 3 shows I–V curves superimposed with an operating load line of the FIG. 2 circuit.

In order to provide a conceptual foundation for the current invention, reference is again made to the prior art MESFET of FIG. 1 and to the associated I–V curves of FIG. 3. At the maximum current point (i.e., $i_{DS}=i_P$, $v_{DS}=V_K$), the gate is fully forward biased. This bias condition maximizes the thickness t of the region gs—i.e., the portion of the surface depletion region 16 directly beneath the gate electrode g. The channel beneath the gate g is said to be "fully open" under the conditions. However, in the drain spacing region ds located between the gate electrode g and the drain n+ region 12, there is no gate electrode "modulating" the surface depletion region thereof. As a result, the resistance of the region ds is higher than that of the region gs and therefore the region ds can be considered as a GaAs resistor in series with the gate modulated region gs. As with any GaAs resistor, the drain spacing region ds has a maximum current it can pass before saturation occurs. This saturation current value depends upon the region's doping (which is the same as in the channel beneath the gate), its thickness (which is determined by surface depletion) and also its length, if it is short enough. Under the right conditions, the maximum channel current of the drain spacing region may be smaller than the maximum channel current of the region gs controlled by the gate. As a result, the maximum current through the FET will decrease as the drain spacing region is increased. The present invention to be described substantially reduces the resistance in the drain spacing region when the gate is fully forward biased, thereby increasing the maximum current which can flow therethrough.

At the other end of the operating locus, the channel is pinched off and the drain to source voltage $v_{DS}$ reaches its maximum. Now, the depletion region extends laterally from the gate into the drain spacing region. The amount of lateral spreading depends upon the thickness of the electron channel—in a device with a thinner channel, the depletion edge will move more when a given voltage is applied—therefore, the resulting field will be weaker. Of course, the drain spacing must also be long enough to allow the depletion region to increase as the drain bias is increased—if the depletion region reaches the edge of the drain n+ region, it will effectively stop moving because of the high doping level of the drain n+ region, and the device will break down. Therefore, from the standpoint of breakdown voltage, it is desirable to have the drain spacing region be long and lightly doped. The present invention to be described utilizes a relatively long drain spacing region in conjunction with a reduced carrier density within the drain spacing region during the high $v_{DS}$ portion of the operating load line, thereby increasing breakdown voltage of the device. The reduced carrier density is obtained via the use of a MIS gate electrode located above the drain spacing region, which receives a time varying bias voltage that reduces the carrier density during appropriate time intervals of the RF cycle.

The process steps in the fabrication of the MES/MIS FET according to the present invention will now be described. The first series of steps are similar to those disclosed in U.S. Pat. No. 4,956,308 entitled "Method of Making Self Aligned Field Effect Transistor", which issued on Sep. 11, 1990 to Griffin et al., and is assigned to the assignee herein, the content of which is incorporated herein by reference.

Figure 4:
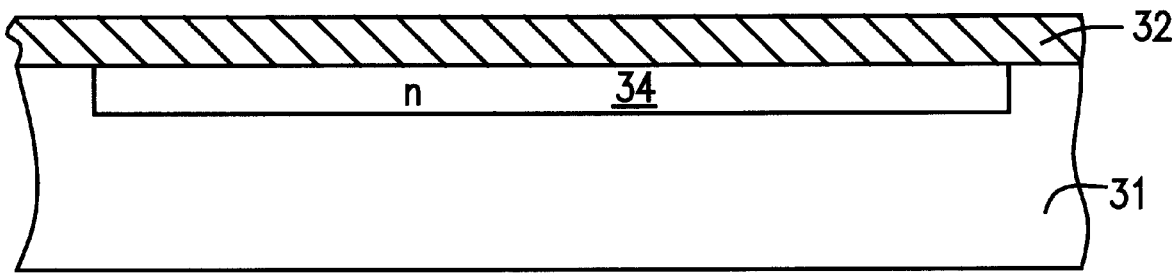
FIGS. 4–8 show cross sections of intermediate structures in the fabrication of the MES/MIS FET according to the invention.

Referring to FIG. 4, there is shown in general a semiconductor wafer or substrate 31. The substrate 31 may preferably be gallium arsenide (GaAs) which would initially be cleaned in solvents and then etched to remove that portion of the substrate which may have been damaged by the use of mechanical slurry polishing processes. Disposed within the substrate 31 is an n doped active channel region 34, which may formed using a conventional process. This may be accomplished by epitaxial layer growth on a suitable substrate, followed by electrical isolation of the intended device area, or alternately, by selective ion implantation of suitable dopants in desired regions of the semiconductor. As indicated, such techniques are well known in the prior art. The entire surface is then coated with a thin layer 32 of suitable metallization having sufficient thermal stability to withstand annealing at a temperature in the range of 750 to 950° C. without degradation of its Schottky barrier properties. Examples of Schottky gate metallizations suitable for this purpose are titanium-tungsten, titanium-tungsten nitride, tungsten nitride, and tungsten silicide, although any metallization which will survive the annealing step may be used.

Figure 5:
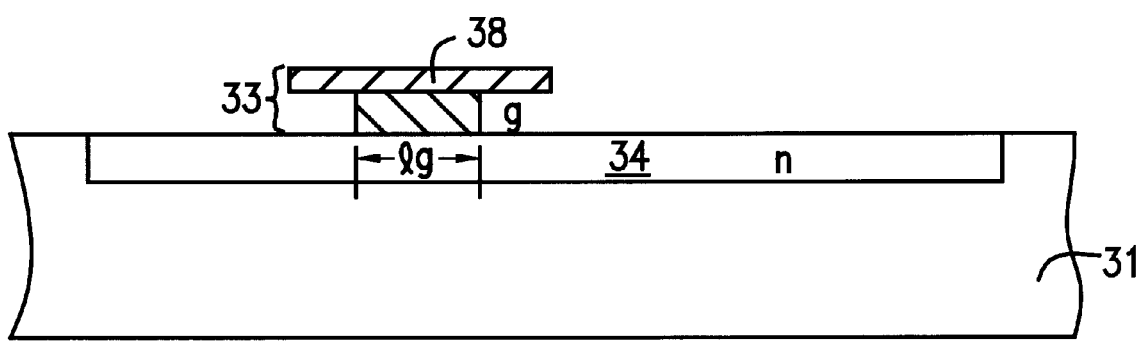

Next, as shown in FIG. 5, a gate electrode structure 33 is defined which consists of a metal etch mask 38 formed atop what is now the gate metallization 32. The length Lg of this gate metal is preferably 0.4–0.5 microns. The preferred technique is to define the metal etch mask 38 by the conventional method of evaporation and liftoff. A preferred etch mask material is nickel, although aluminum is also suitable for this purpose. Excess gate metal is then removed by plasma or reactive-ion etchings, leaving gate metal only under the etch mask 38.

Figure 6:
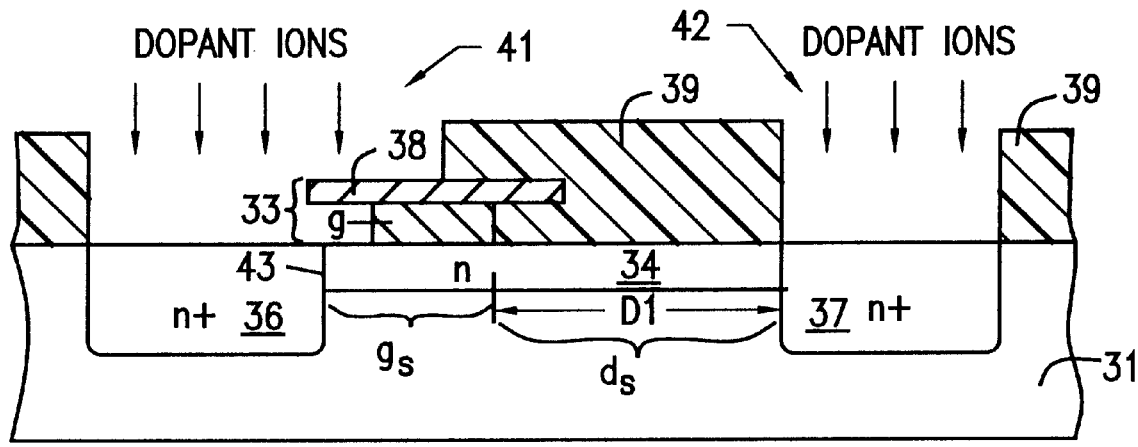

With reference now to FIG. 6, the process follows accordingly. The wafer 31 is coated with a photoresist mask 39 and patterned to form openings 41 and 42 on both sides of the device. Dopant ions are then implanted into the semiconductor in the region of the openings 41 and 42 forming an asymmetrical device structure with the gate structure 33 adjacent to the n+ source region 36 but separated from the n+ drain region 37 by a distance D1. The preferred distance D1 for this separation is approximately 1.5 $\mu$m to provide an "extended" drain spacing region ds. The use of the extended drain region ds is a contributing factor to improving breakdown voltage of the device. It is noted that the metal etch mask 38 acts as a mask to the dopant ions so as to define the inner edge 43 of the source region 36. The resulting configuration is thus known as a self aligned gate (SAG) device in which the gate is offset towards the source. The shown structure is substantially planar with the top surfaces of the drain, channel and source regions lying in the same plane.

Figure 7:
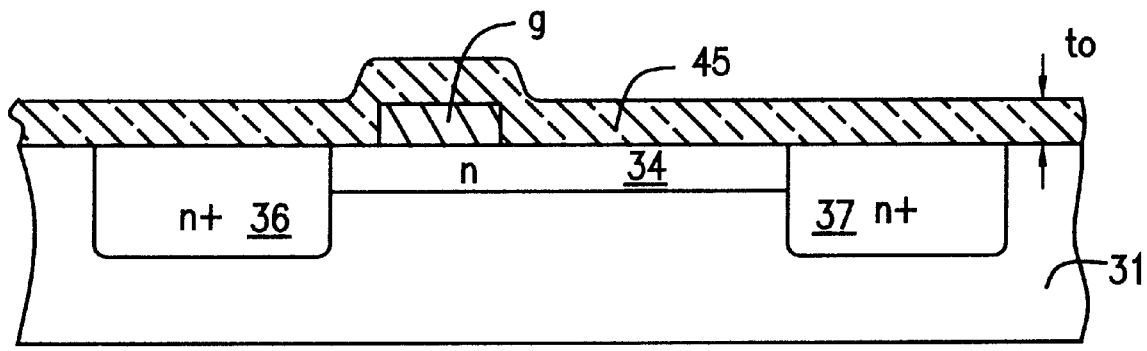

As shown in FIG. 7, the metal etch mask 38 is then removed, whereupon the wafer is encapsulated with a suitable dielectric 45 in such a way as to cover the gate electrode. A preferred encapsulant is silicon oxy-nitride, although silicon dioxide and silicon nitride are also suitable for this purpose. The dielectric layer 45 is deposited at a thickness t0 on the order of 0.2 microns. The encapsulated wafer is then annealed at a temperature and time sufficient to remove ion implant damage from the semiconductor and activate the implanted dopant ions. Preferred annealing temperatures are in the range of 750 to 900° if done in a conventional furnace system, or 800 to 1000° C. if done in an infra-red lamp system by rapid thermal annealing.

Figure 8:
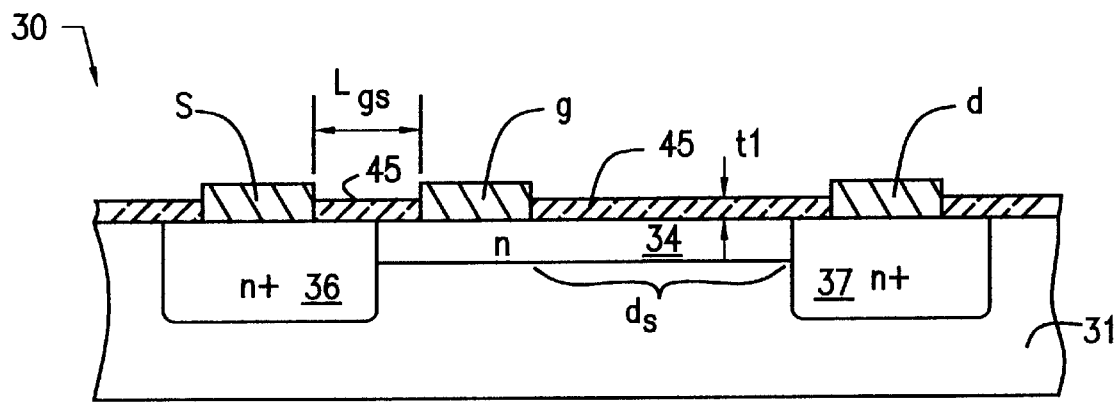

Referring now to FIG. 8—after annealing, the dielectric layer 45 is removed from the surface of the gate metallization 32 and then polished down to a thickness t1 of about 0.1 microns. A pair of openings are then created in the dielectric layer 45 above the source and drain regions 36 and 37, into which respective source and drain ohmic contacts s and d are deposited by evaporation and liftoff. The material for these ohmic contacts may be a mixture of gold, germanium and nickel, with a thickness on the order of 0.5 microns.

Figure 9:
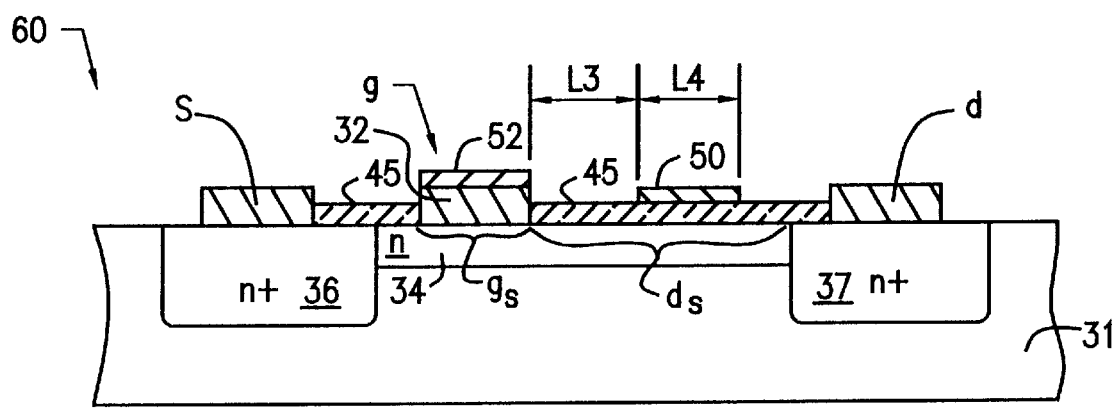
FIG. 9 is a cross section of a completed MES/MIS FET according to the present invention.

Thereafter, as shown in FIG. 9, metallization layers 50 and 52 are simultaneously deposited on the dielectric layer 45 with the layer 50 deposited within the drain spacing region ds and the layer 52 deposited on the gate ohmic metallization 32. The metallizations 32 and 52 together form the MES gate g of the resulting device. The metallization 50 forms the metal-insulator-semiconductor (MIS) gate of the resulting device. Preferably, the material for the layers 50 and 52 is gold, and the thickness 0.5 microns.

The resulting structure 60 is termed a MIS/MES FET and has improved maximum current handling and gate to drain breakdown performance as will be explained below. The MIS gate 50 has a length L4 which may be 0.5 microns. The separation distance L3 between the MES gate g and the MIS gate 50 is preferably about 0.5 microns. After patterning, the device 60 is heated to a temperature of between 350 and 500° to alloy the ohmic contacts, resulting in the finished MES/MIS FET 60 exclusive of external interconnections to other circuit elements.

The addition of the MIS gate 50 to the MESFET structure—i.e., the structure 60 of FIG. 9 absent the MIS gate 50—allows the carrier density in the drain spacing region ds to be independently "modulated" or controlled. That is, the carrier density in region ds can be increased by applying a positive voltage to the MIS gate 50, thereby enabling a larger maximum current to flow therethrough. Likewise, by applying a negative voltage to the MIS gate 50, the carrier density in the drain spacing region ds is decreased, thereby increasing the gate to drain breakdown voltage. When the MES/MIS FET 60 is placed in a circuit which supplies appropriate voltages, the drain spacing region can be modulated as required to give the device both high breakdown voltage and large maximum channel current.

Figure 10:
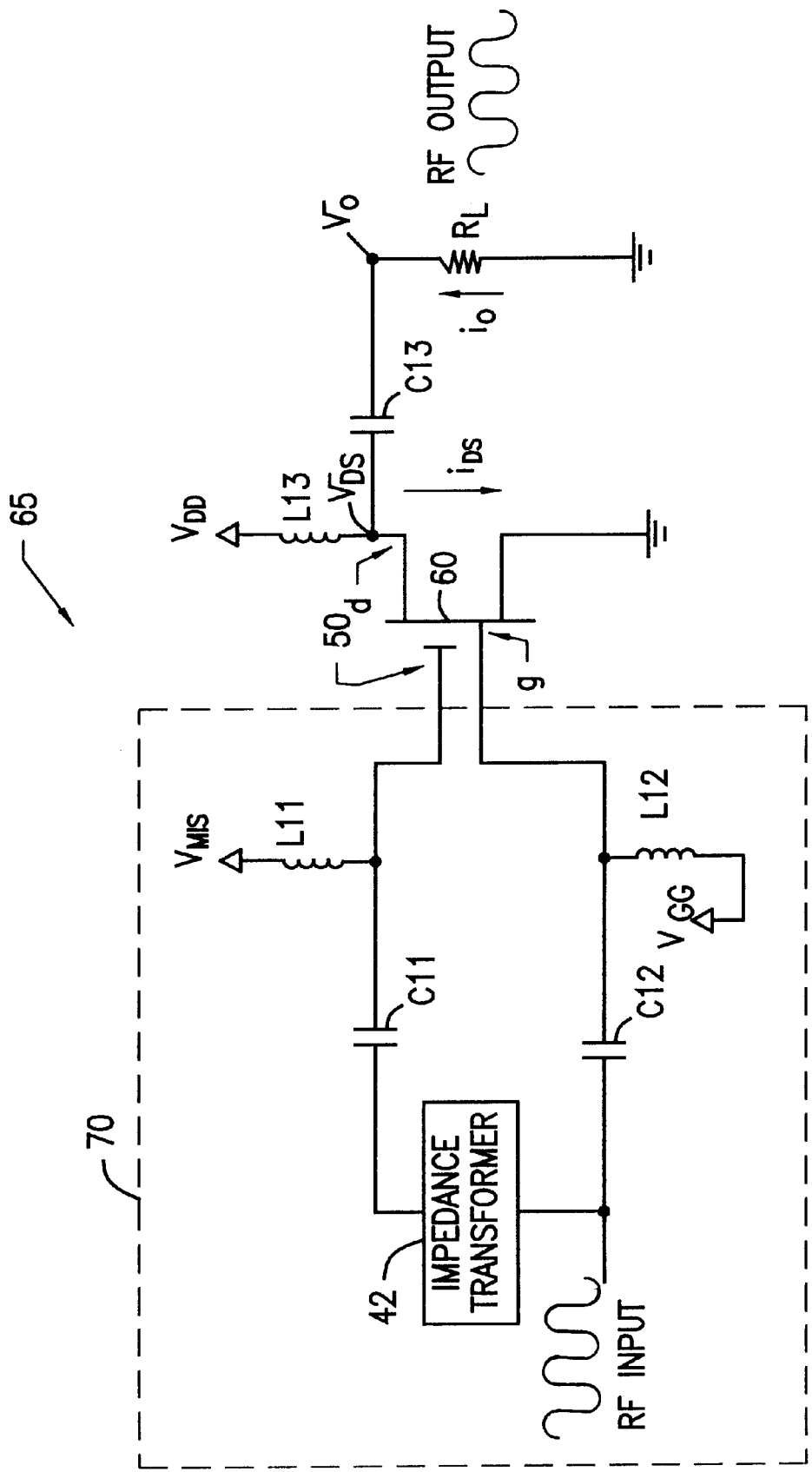
FIG. 10 is a schematic of an amplifier circuit employing the MES/MIS FET of FIG. 9.

With reference now to FIG. 10, there is shown an amplifier circuit 65 employing the above described MES/MIS FET 60 as the active element. The shown circuit arrangement provides improved output power performance over prior art circuits that utilize a MESFET device of a similar size to that of the MES/MIS FET 60. Output power is superior with the circuit 65 as a result of the MES/MIS FET 60 having higher maximum current and gate-drain breakdown voltage characteristics.

The biasing used in the circuit 65 to produce the improved output power is a combination of DC and AC biasing. The DC bias voltages $V_{MIS}$, $V_{GG}$ and $V_{DD}$ are applied to the respective MIS gate 50, MES gate g and drain electrode d via the associated AC chokes L11–L13. Chip capacitors C11–C13 operate as DC blocks to isolate the DC bias within the circuit. The AC biasing originates from the RF input signal itself to provide what is commonly known as large signal operation. Various classes of large signal operation are possible with the circuit 65 by varying the DC gate bias $V_{GG}$. Thus, Class A, AB, B or C operation is possible via appropriate selection of $V_{GG}$. The principles governing these classes of power amplifier operation are well known to those skilled in the art and therefore need not be elaborated upon further. With large signal operation, the circuit analysis is nonlinear and therefore empirical techniques may be relied upon to determine the optimum input matching structures and output load impedance.

With the circuit 65, the RF input signal is divided between the MIS gate 50 and the MES gate g via the use of an impedance transformer 42. The transformer 42, which may be a Wilkinson type divider/transformer, enables a higher AC voltage to be applied to the MIS gate 50 than to the MES gate g. A higher bias voltage is necessary on the MIS gate 50 to control carrier density within the drain spacing region ds due to the dielectric layer 45 separating the MIS gate 50 from the semiconductor (FIG. 9). A relatively higher positive bias voltage (DC plus AC) applied to the MIS gate 50 would be required to produce the same increase in carrier density within the region ds, as could be produced in the region gs with a lower voltage applied to the MES gate g. Likewise, a more negative bias voltage (DC plus AC) applied to the MIS gate 50 will produce a decrease in carrier density within the region ds of the same order of magnitude as that in the region gs caused by a less negative bias voltage applied to the MES gate g.

Figure 2:
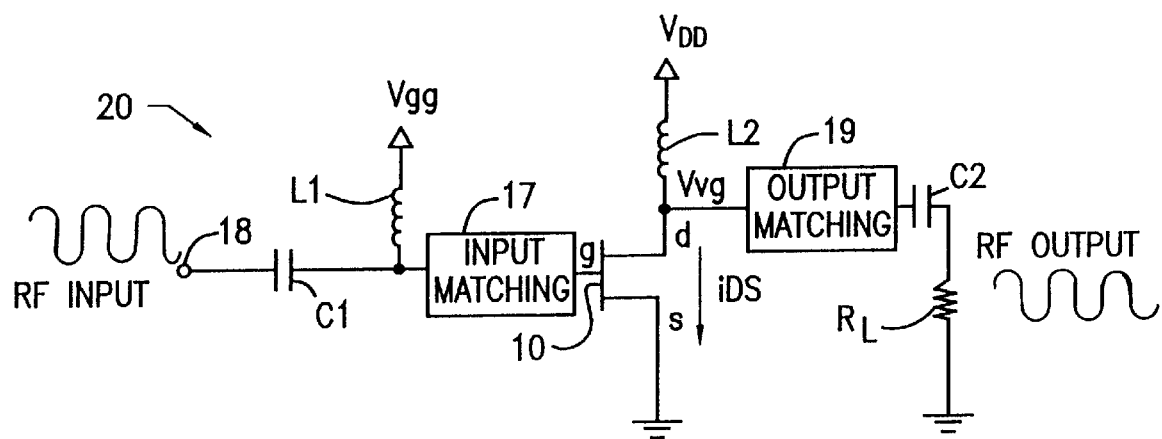
FIG. 2 shows a prior art amplifier circuit employing the MESFET of FIG. 1.
Figure 11:
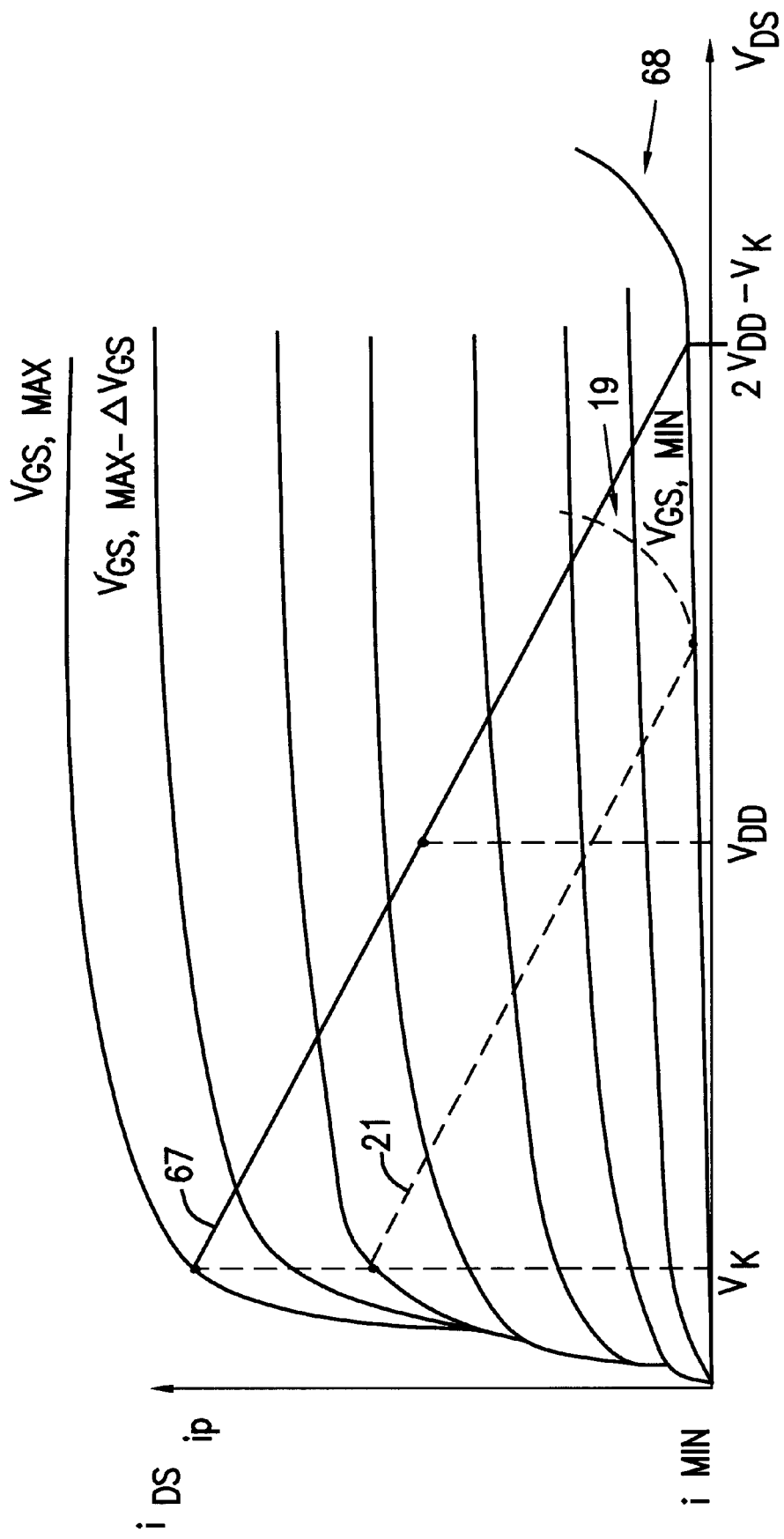
FIG. 11 shows I–V curves of the MESFET superimposed with an operating load line of the circuit of FIG. 12.

With the circuit 65, the AC swing of the output current $i_o$ across the load resistor $R_L$ is higher and the AC output voltage $v_o$ is increased, resulting in higher output power as compared to a circuit using a similarly sized MESFET device. The higher gate to drain breakdown voltage enables a higher DC drain bias $V_{DD}$ to be applied to drive the AC output voltage $v_o$ higher. The output power is increased due to a higher maximum current $i_{DS}$ (DC plus AC components) during the positive portion of the RF cycle, and a higher voltage $v_{DS}$ (DC plus AC component) during the negative portion of the RF cycle. This is illustrated in FIG. 11 which shows general load line characteristics of the circuit 65 superimposed with I–V characteristics of the MES/MIS FET 60. A load line 67 has one extreme at a maximum current point $i_{DS}=i_P$ at $v_{GS}=v_{GS,MAX}$, corresponding to $v_{DS}=V_K$ (knee voltage). The other extreme is at the intersection of $v_{DS}=(2V_{DD}-V_K)$ with the $v_{GS}=v_{GS,MIN}$ curve, corresponding to $i_{DS}=i_{min}$. The region 68 represents the breakdown region of the MES/MIS FET 60. Superimposed with the curves of FIG. 11 is the load line 21 and associated breakdown region 19 of a similarly sized prior art MESFET (as was described in reference to FIGS. 2 and 3), thus illustrating the improved performance with the MES/MIS FET 60.

The timing diagrams of FIGS. 12A–12D further illustrate the operation of the circuit 65 of FIG. 10. During the positive swing of the RF input signal—i.e., during the time intervals 0–0.5T and T–1.5T where T is the period of the RF signal—the MIS gate voltage $v_{MIS}$ swings to a maximum positive voltage $v_{MIS,MAX}$ which is higher than the maximum $v_{GS}$ voltage $v_{GS,MAX}$. The DC bias voltages $V_{MIS}$ and $V_{GG}$ (which are the respective DC portions of the time varying gate voltages $v_{MIS}$ and $v_{GG}$) are preferably negative voltages with $V_{MIS}$ being set slightly lower than $V_{GG}$. However, it is understood that the selection of these DC bias voltages will depend on the device characteristics and that one may vary either of these parameters to obtain a desired breakdown voltage and maximum channel current.

Figure 12A:
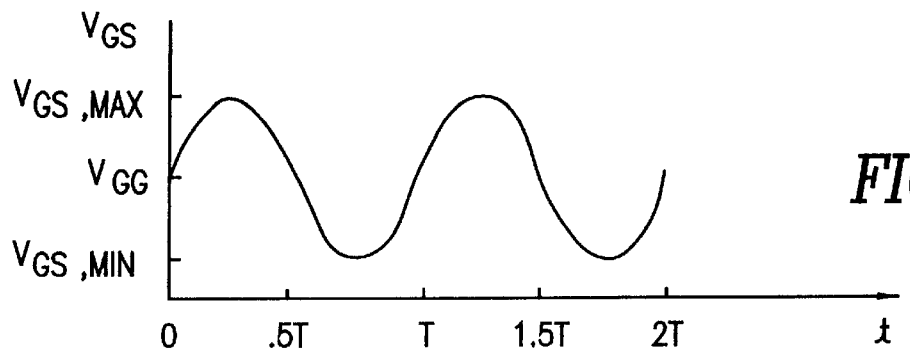
FIGS. 12A–12D show time varying voltages and currents within the circuit of FIG. 10.
Figure 12B:
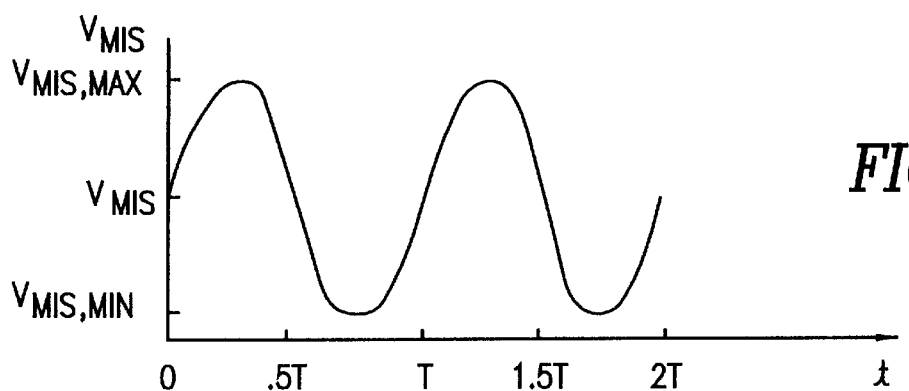
Figure 12C:
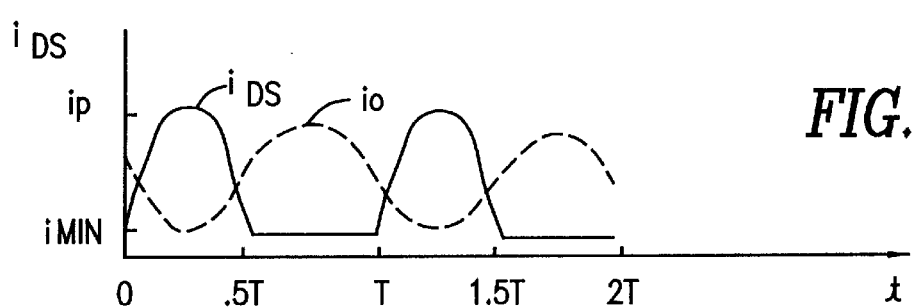
Figure 12D:
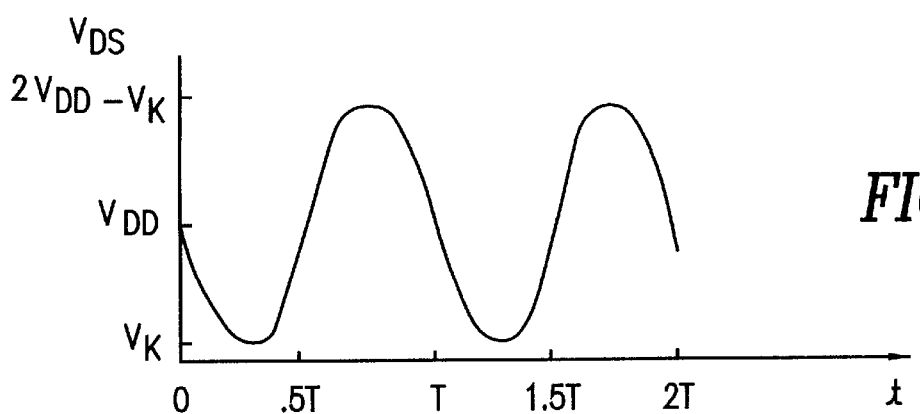

As shown in FIG. 12C, the current $i_{DS}$ peaks up to the value $i_P$ during the positive half cycles. Since the voltage $v_{MIS}$ (AC plus DC components) is positive while $i_{DS}$ is approaching its peak $i_P$, the carrier density within the drain spacing region is increased and thus a higher value of $i_P$ is obtainable. The shown $i_{DS}$ current waveform is that of class B operation—that is, a positive half sinusoid for the first half of a cycle, and "off" during the second half. Practically, $i_{DS}$ never reaches zero during the "off" portion but rather, a minimum current $i_{min}$ flows. The output current $i_o$ shown superimposed in FIG. 12C is essentially the fundamental frequency component of $i_{DS}$ with reversed polarity. (With class B operation, as well as with class AB or C, the time varying drain to source current $i_{DS}$ is composed of a fundamental frequency and harmonic frequencies. Appropriate harmonic filtering is required in the output matching to provide a fundamental frequency output with low harmonic levels). As shown in FIG. 12D, the voltage $V_{DS}$ reaches a knee voltage $V_K$ while the current is peaking so that power dissipation within the MIS/MES FET 60 is minimized—a natural consequence of class B operation. In any event, while class B advantageously affords high efficiency, other classes of operation are possible with the circuit arrangement 65 of FIG. 10.

During the negative swings of the input RF signal, $v_{MIS}$ approaches a minimum value $v_{MIS,MIN}$ which is a negative voltage while the drain to source voltage $v_{DS}$ is swinging towards its positive peak $V_{DD}-V_K$. The negative voltage $v_{MIS,MIN}$ decreases the carrier density within the drain spacing region thereby enabling a higher voltage $(2V_{DD}-V_K)$ to be reached without voltage breakdown, yielding higher output power. The DC bias voltage $V_{DD}$ can thus be raised, and the load impedance RL (in conjunction with appropriate output impedance matching, if used) tailored accordingly to maximize this peak voltage $(2V_{DD}-V_K)$.

Figure 13:
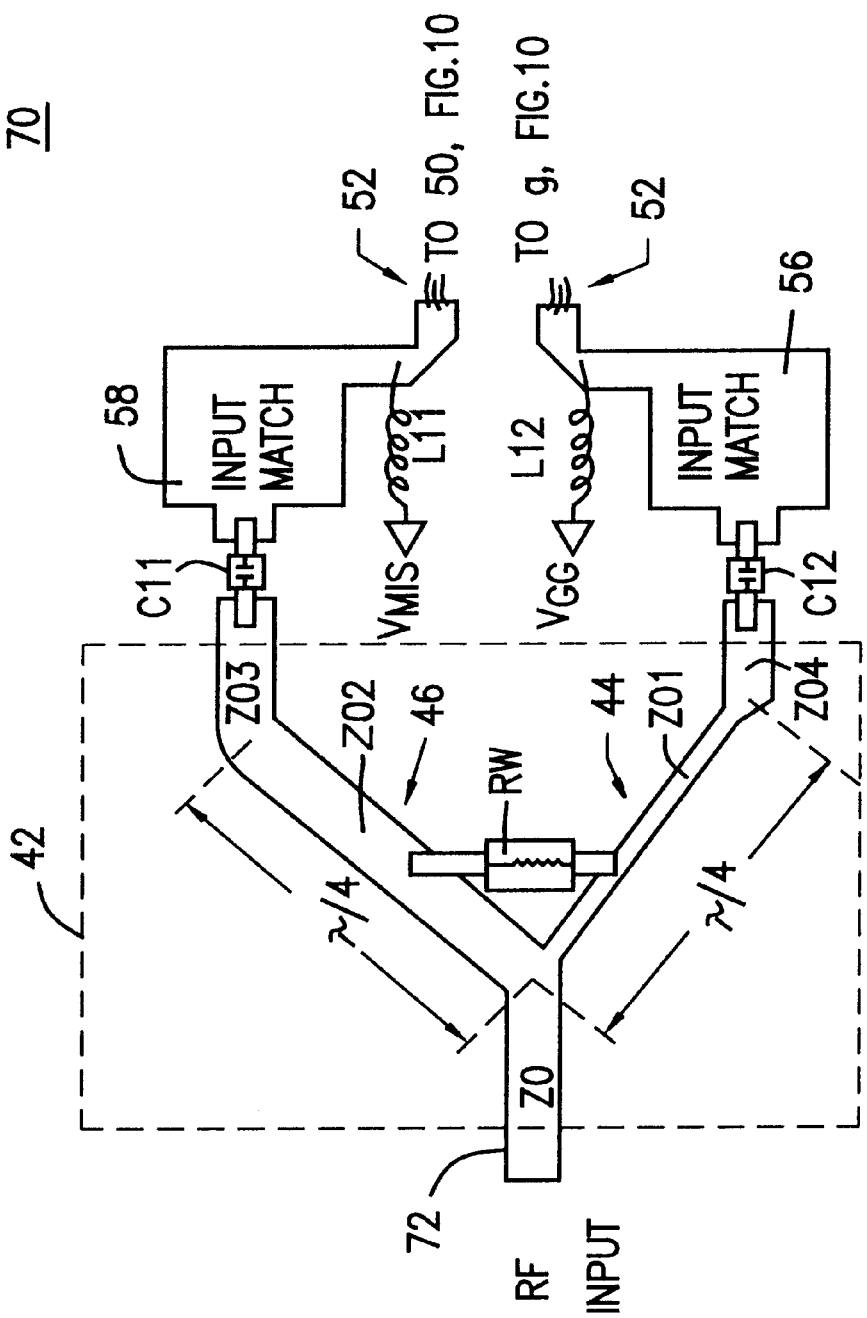
FIG. 13 shows a microstrip input section for use in the circuit of FIG. 10.

Referring now to FIG. 13, a microstrip input section 70 is shown which may be used as the input section 70 for the circuit 65 of FIG. 10. The RF input is divided and transformed by means of a Wilkinson type divider/transformer 42. Quarter wavelength long branch arms 44 and 46, of unequal characteristic impedances Z01 and Z02 are employed to produce an unequal power split. Since Z02 is a higher impedance than Z01, the MIS gate 50 will ultimately receive a larger AC bias voltage than will the MES gate g of the MES/MIS FET 60. The Wilkinson divider 42 transforms the characteristic impedance Z0 of the input transmission line 72 to a lower impedance. A chip resistor Rw soldered between the branch arms is utilized to absorb unbalanced reflected signals. Following the DC blocking chip capacitors C11 and C12 are respective input matching structures 56 and 58. These can be transmission line sections of variable length and width, with capacitive or inductive tuning stubs between successive sections. The electrical length from the end of the branch arm 46 through the matching structure 58 to the wire bonds 50, should be about the same as the electrical length from the end of the branch arm 44 through the matching structure 56 to the wire bonds 50. This will ensure that the $v_{GS}$ and $v_{MIS}$ voltage waveforms shown in FIGS. 12A and 12B will be in phase synchronization for proper circuit operation.

The matching structures 56 and 58 may be derived empirically utilizing what is known as "source pull" and "load pull" techniques as is understood by those skilled in the art. With these techniques, the impedances and lengths used for the matching structures are varied while data is taken until an optimum configuration is reached, which will depend upon the performance goals of the circuit. With the input section 70 wire bonded to the MES gate g and MIS gate 50 via the wire bonds 52, circuit parameters such as gain, output power, efficiency, stability and so on are measured. The data is repeated each time one of the matching structures 56 or 58 is varied. In addition, the output impedance RL may be empirically varied along with output matching structures (not shown) to determine the optimum load impedances at the fundamental and harmonic frequencies.

The MES/MIS FEF 60 of FIG. 10 may be fabricated within a hermetically sealed package with leads for the MES gate g, MIS gate 50 and drain d that are solderable to external microstrip or stripline. The wire bonds 52 of FIG. 13 will then of course be contained within the hermetically sealed package and soldered internally to the leads. Alternatively, the entire circuit 65 may be fabricated as a monolithic microwave integrated circuit (MMIC) to provide an internally matched FET which can be readily used with typically 50 ohm input and output transmission lines.

It will be understood that the embodiments described herein are merely exemplary and that one may make many modifications and variations to the shown embodiments without departing from the spirit and scope of the invention. All such modifications and variations are intended to be included within the scope of the invention as defined by the appended claims.

What is claimed is:

1. In a gallium arsenide based metal-semiconductor field-effect-transistor (MESFET) having a substrate including a source region, a drain region, a channel region disposed between the source and drain regions, a source electrode disposed on the source region, a drain electrode disposed on the drain region, and a metal-semiconductor (MES) gate electrode formed by a layer of metallization disposed directly on only a first portion of the channel region, the improvement therewith comprising:

a dielectric layer having a first segment extending from the source electrode to a first edge of the MES gate electrode and a second segment extending from a second edge of the MES gate electrode to the drain electrode, the second segment having a first portion disposed on the channel region and a second portion disposed on the drain region; and a metal-insulator-semiconductor (MIS) gate electrode formed by a layer of metallization disposed on the first portion of the second segment of the dielectric layer so that the MIS gate electrode only overlies a second portion of the channel region;

wherein the MES and MIS gate electrodes permit receipt of first and second divided signal portions of an input RF signal, the MES gate electrode being responsive to the first divided signal portion and a first bias voltage for selectively adjusting carrier density within the first portion of the channel region thereby controlling current flow between the source region and the drain region, and the MIS gate electrode being responsive to the second divided signal portion and a second bias voltage for selectively adjusting carrier density within the second portion of the channel region thereby increasing gate-drain voltage breakdown and current handling capacity of the MESFET.

2. The transistor according to claim 1, wherein said MIS gate electrode is operable to increase breakdown voltage of said transistor when said second bias voltage is negative.

3. The transistor according to claim 2 wherein said MIS gate electrode is operable to increase maximum current which can flow within the second portion of said channel region when said second bias voltage is positive.

4. The transistor according to claim 3 further including in combination therewith, circuit means coupled to said transistor for amplifying said input RF signal, said circuit means comprising:

means for providing said second bias voltage as an alternating current (A/C) bias voltage to said MIS gate electrode, said A/C bias voltage being positive during at least a portion of a first half cycle of said RF signal, and negative during at least a portion of a second half cycle of said RF signal, whereby said A/C bias voltage being positive enables higher maximum current to flow through said transistor, and said A/C bias voltage being negative increases breakdown voltage of said transistor.

5. The transistor according 4 wherein said means for providing an A/C bias voltage comprises:

means coupled to said transistor for dividing said input RF signal to provide said first divided signal portion of said RF input signal and said second divided signal portion of said input signal; and means for applying said first divided signal portion of said input RF signal to said MES gate electrode, and for applying said second divided signal portion of said input RF signal to said MIS gate electrode.

6. A field-effect-transistor (FET), comprising:

a GaAs substrate including a source region, a drain region, and a channel region disposed between the source and drain regions;

a source ohmic contact disposed on the source region;

a drain ohmic contact disposed on the drain region;

a metal-semiconductor (MES) gate electrode formed by a layer of metallization disposed directly on only a first portion of the channel region;

a dielectric layer having a first segment extending from the source electrode to a first edge of the MES gate electrode and a second segment extending from a second edge of the MES gate electrode to the drain electrode, the second segment having a first portion disposed on the channel region and a second portion disposed on the drain region; and a metal-insulator-semiconductor (MIS) gate electrode formed by a layer of metallization disposed on the first portion of the second segment of the dielectric layer so that the MIS gate electrode only overlies a second portion of the channel region;

wherein the MES and MIS gate electrodes permit receipt of first and second divided signal portions of an input RF signal, the MES gate electrode being responsive to the first divided signal portion and a first bias voltage for selectively adjusting carrier density within the first portion of the channel region thereby controlling current flow between the source region and the drain region, and the MIS gate electrode being responsive to the second divided signal portion and a second bias voltage for selectively adjusting carrier density within the second portion of the channel region thereby increasing gate-drain voltage breakdown and current handling capacity of the MESFET.

7. The FET according to claim 6 wherein said second bias voltage is operable to increase output power that can be provided by FET.

8. The FET according to claim 6 wherein said channel region is doped n type, and said source and drain regions are each doped n+.

9. The FET according to claim 8 wherein the second portion of the channel is part of a drain spacing region that extends from underneath the first edge of the MES gate electrode to the drain region, said drain spacing region has a length of 1.5 micrometers in order to increase breakdown voltage of said FET.

10. The FET according to claim 9 wherein said source, drain and channel regions define a substantially planar surface.

11. The FET according to claim 6 wherein the spacing between said first gate electrode and said second gate electrode is about 0.5 microns and wherein the thickness of said dielectric layer is about 0.1 microns.

12. An amplifier circuit for amplifying a high frequency input signal, comprising:

a field effect transistor (FET) having doped source, drain and channel regions, and a metal-semiconductor (MES) gate electrode disposed directly on said channel region and having a first edge located adjacent to said drain region and a metal-insulator-semiconductor (MIS) gate electrode, said MIS gate electrode including a portion of an insulator layer having a first edge in contact with said first edge of said MES gate electrode and extending therefrom to terminate at a second edge overlying said drain region, said channel region including a drain spacing region between said first edge of said MES gate electrode and said drain region that exceeds the spacing between said first edge of said MES gate electrode and said source region;

means coupled to said FET for dividing said high frequency input signal to provide a first divided portion of said input signal and a second divided portion of said input signal comprising an impedance transformer for providing a first AC bias voltage of a first given magnitude to be applied to said MES gate electrode, and a second AC bias voltage of a second given magnitude greater than said first given magnitude to be applied to said MIS gate electrode; and means for applying said first divided portion of said input signal to said MES gate electrode, and said second divided portion of said input signal to said MIS gate electrode, said second portion of said input signal being operable to control carrier density within said FET to thereby control performance parameters of said FET.

13. The amplifier circuit according to claim 12 wherein said FET comprises:
- a semiconductor body including said doped source, drain and channel regions therein, with said channel region between said source and drain regions;
- source and drain ohmic contacts disposed respectively on said source and drain regions;
- a first gate electrode on said channel region forming said MES gate electrode;
- a dielectric layer on said drain spacing region forming said insulator layer; and
- a second gate electrode on said dielectric layer forming said MIS gate electrode, whereby said second portion of said input signal applied to said MIS gate electrode controls carrier density within said drain spacing region.

14. The amplifier circuit according to claim 12 wherein said impedance transformer comprises a Wilkinson type power divider having branch arms of unequal characteristic impedances.

15. A method for increasing gate-drain voltage breakdown and current handling capacity of a gallium arsenide based metal-semiconductor field effect transistor (MESFET) having a substrate including a source region, a drain region, a channel region disposed between the source and drain regions, a source electrode disposed on the source region, a drain electrode disposed on the drain region, and a metal-semiconductor (MES) gate electrode formed by a layer of metallization disposed directly on only a first portion of the channel region, the method comprising the steps of:
- providing a dielectric layer having a first segment extending from the source electrode to a first edge of the MES gate electrode and a second segment extending from a second edge of the MES gate electrode to the drain electrode, the second segment having a first portion disposed on the channel region and a second portion disposed on the drain region;
- providing a metal-insulator-semiconductor (MIS) gate electrode formed by a layer of metallization disposed on the first portion of the second segment of the dielectric layer so that the MIS gate electrode only overlies a second portion of the channel region;
- applying a first divided signal portion of an input RF signal and a first bias voltage to the MES gate electrode to selectively adjust carrier density within the first portion of the channel region thereby controlling current flow between the source region and the drain region; and
- applying a second divided signal portion of the input RF signal and a second bias voltage to the MIS gate electrode to selectively adjust carrier density within the second portion of the channel thereby increasing gate-drain voltage breakdown and current handling capacity of the MESFET.

* * * * *